US006810095B2

(12) United States Patent
Naitou

(10) Patent No.: US 6,810,095 B2
(45) Date of Patent: Oct. 26, 2004

(54) VITERBI DECODER WITH REDUCED NUMBER OF BITS IN BRANCH METRIC CALCULATION PROCESSING

(75) Inventor: Takahiro Naitou, Tokyo (JP)

(73) Assignee: NEC Corporation, Tokyo (JP)

( * ) Notice: Subject to any disclaimer, the term of this patent is extended or adjusted under 35 U.S.C. 154(b) by 728 days.

(21) Appl. No.: 09/734,892

(22) Filed: Dec. 13, 2000

(65) Prior Publication Data
US 2001/0004391 A1 Jun. 21, 2001

(30) Foreign Application Priority Data
Dec. 20, 1999 (JP) .......................................... 11-361487

(51) Int. Cl.[7] .......................... H04L 27/06; H04L 27/22
(52) U.S. Cl. ..................................... 375/341; 375/316
(58) Field of Search ................................. 375/341, 262, 375/265, 267, 340, 347, 349, 316; 371/43.4, 43.7, 43.8; 714/795

(56) References Cited

U.S. PATENT DOCUMENTS

| 5,220,570 A | | 6/1993 | Lou et al. ..................... 371/43 |
| 5,469,452 A | | 11/1995 | Zehavi ......................... 371/43 |
| 5,471,500 A | * | 11/1995 | Blaker et al. ................ 375/340 |
| 5,502,735 A | * | 3/1996 | Cooper ........................ 714/794 |
| 5,651,032 A | | 7/1997 | Okita ........................... 375/341 |
| 5,710,784 A | | 1/1998 | Kindred et al. ............... 371/43 |
| 5,787,127 A | * | 7/1998 | Ono et al. .................... 375/341 |
| 5,862,190 A | * | 1/1999 | Schaffner .................... 375/341 |
| 5,946,361 A | * | 8/1999 | Araki et al. .................. 375/341 |
| 6,438,181 B1 | * | 8/2002 | Setlur et al. ................. 375/341 |

FOREIGN PATENT DOCUMENTS

| CN | 1133660 | 10/1996 |
| CN | 1162873 A | 10/1997 |
| JP | 6-303153 | 10/1994 |
| JP | 7-131494 | 5/1995 |
| JP | 10-200419 | 7/1998 |
| WO | WO 95/08888 | 3/1995 |

* cited by examiner

Primary Examiner—Stephen Chin
Assistant Examiner—Jason M. Perilla
(74) Attorney, Agent, or Firm—Foley & Lardner LLP

(57) ABSTRACT

A Viterbi decoder with a reduced number of bits in branch metric calculation processing is disclosed. In a branch metric calculator, word split circuits divide metric data 1 to 3 from respective latch circuits into the signs of the least 1 bit and metrics of k−1 bits, respectively. EX-OR gates determine whether or not the divided signs (1 bit) match codewords (1 bit) for each state produced from a convolutional code generated by a convolutional code generator and a counter. Each time-division switch for 1 bit selects the output of the match or mismatch with switched timing. Adders add outputs when the signs match to the divided metrics output from selectors when the signs do not match based on the selection to calculate a branch metric.

12 Claims, 4 Drawing Sheets

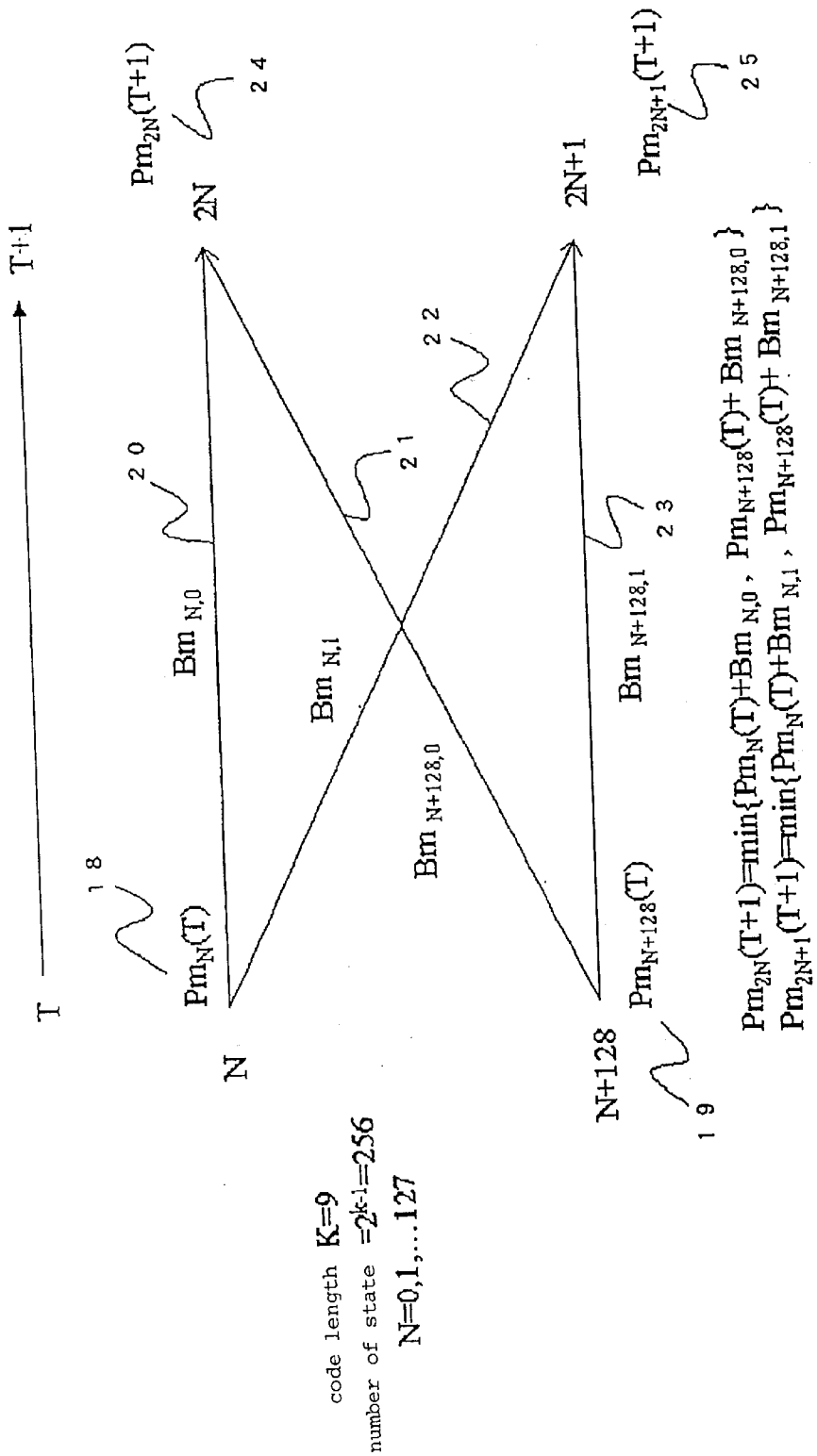

VITERBI DECODER WITH REDUCED NUMBER OF BITS IN BRANCH METRIC CALCULATION PROCESSING

BACKGROUND OF THE INVENTION

1. Field of the Invention

The present invention relates to a branch metric calculation method and a Viterbi decoder in Viterbi decoding in which a branch metric is derived by comparing a codeword produced from a convolutional code with a sign in determination data obtained from conversion of received data for branch metric calculation.

2. Description of the Related Art

Conventionally, in mobile stations in digital cellular mobile telephone systems of a TDMA scheme or a CDMA scheme and digital satellite communication of the CDMA scheme, errors arising in transmission paths are corrected with an error correcting code for obtaining desired channel quality. In the processing with the error correcting code, error bits are detected for correction. The code for the correction is broadly divided, based on methods of random error correction, into a block code or a convolutional code and a concatenated code in which the block code and convolutional code are combined.

Viterbi decoding is well known as decoding at a receiving part for the convolutional code (see Literature "Digital Satellite Communication," Kazunori Tamura and Tatsuro Masamura, The Telecommunications Association). The Viterbi decoding is an algorithm which can efficiently perform maximum likelihood decoding with the convolutional code by selecting the path closest to the received sequence from two paths joining from certain states. The Viterbi decoding has a relatively high ability for correcting errors arising in transmission paths, and produces high coding gain in combination with a Soft-Decision Decoding scheme. The Viterbi decoding, however, involves large processing and circuit scales, and reductions thereof are problems to be tackled.

Branches are produced corresponding to states of respective node decoders in a tree representation which is a representation for the convolutional code. Specifically, the tree representation is a trellis representation for showing changes in states of independent coders in which two branches are produced corresponding to state 0 or state 1 for input 1 bit. From the trellis, metrics are calculated for providing certainty of paths or branches. In the branch metric calculation method, a codeword of each state produced from the convolutional code is compared with a sign in determination data, and if they match, it is determined that the associated metric is 0, or if they do not match, the metrics of the determination data are added to calculate a branch metric.

FIG. 1 is a circuit diagram showing a configuration for performing conventional branch metric calculation. In FIG. 1, description is made on the assumption that the coding rate is ⅓ and the number of states is 256.

Metric data 1, 2 and 3 are supplied to latch circuits 26a, 26b and 26c, respectively. Latch circuits 26a to 26c hold metric data 1 to 3, respectively, until latch pulses are supplied thereto. After the latching, latch circuits 26a to 26c output metric data of K bits for state N. Inverters 27a, 27b and 27c invert the metric data of K bits for N state to metric data of k bits for state N+128 before output.

The metric data of K bits for state N and the metric data of k bits for state N+128 are supplied to time-division switches 28a, 28b and 28c. Time-division switches 28a to 28c switch to select and output the metric data for state N or the metric data for state N+128, respectively, in accordance with timing pulses.

The aforementioned number of states 256 is a typical value for the number of states in the Viterbi decoding in a digital cellular mobile telephone system or the like. The number "128" in the metric data of k bits for state N+128 is equal to ½ of the number of states 256 for a butterfly structure in state transition in the Viterbi decoding, later described in FIG. 4.

The metric data for state N or the metric data for state N+128 selected by time-division switches 28a to 28c are supplied to word split circuits 29a, 29b and 29c, respectively. Word split circuits 29a to 29c divide the metric data for state N or the metric data for state N+128 into signs and metrics before output, respectively. The sign of 1 bit separated at each of word split circuits 29a to 29c is supplied to each of EX-OR (exclusive OR) gates 33a to 33c. EX-OR gates 33a to 33c also receive codewords (g0, g1 and g2) for each state obtained from processing in convolutional code generator 35, and counter (N=0 to 127) 34, and make determination about the signs with EX-OR operations.

In accordance with the outputs from EX-OR gates 33a to 33c, selectors 30a, 30b and 30c select the metrics from word split circuits 29a to 29c or 0 (Z). The selected outputs are added at adders 32a and 32b to calculate a branch metric.

The Viterbi decoding for performing such branch metric calculation involves large processing and circuit scales as compared with processing of threshold decoding in block coding (for example, with BHC code or Golay code) and in convolutional coding or the like, and reductions thereof are problems to be tackled. Thus, various proposals have been made for reducing the processing and circuit scales.

As one of the proposals, in a prior art of "Viterbi Decoder" in Japanese Patent Laid-open Publication No.6-303153, outputs from branch metric operation means which are supplied to an ACS (Add/Compare/Select) unit are controlled in a time-division manner for reducing the circuit scale of the Viterbi decoder. For maximum likelihood determination in maximum likelihood determination means, outputs from path metric resistors are processed in a time-division manner at compare/select circuits in the ACS unit. The scale of the maximum likelihood determination means is thus reduced to reduce the processing and circuit scales of the Viterbi decoder.

In a prior art of "Branch Metric Operation Circuit" in Japanese Patent Laid-open Publication No.7-131494, for reducing the processing and circuit scales resulting from the reduced number of bits in a branch metric operation circuit, trellis decoding uses the square of the Euclid distance between received symbols and representative symbols of a subset, and the square of the Euclid distance is used as a branch metric as it is. Also, bits are reduced by imposing amplitude limitations on the received symbol. In addition, bits are truncated at an output of Euclid distance calculation means to reduce the processing and circuit scales.

In a prior art of "Viterbi Decoding Method and Apparatus" in Japanese Patent Laid-open Publication No.10-200419, a path memory update operation and an output operation are simultaneously performed and respective sets of units are alternately operated with shifted phases. Thus, the scale of the path memory is reduced, and the processing and circuit scales are reduced in the Viterbi decoder.

The aforementioned prior art Viterbi decoders have the large processing and circuit scales, and reductions in the scales are problems to be overcome.

In the prior art shown in FIG. 1, the metric data of K bits for state N or the inverted metric data of k bits for state N+128 after the latching is selected by time-division switches 28a to 28c for k bits in accordance with the timing pulses. Therefore, when multiplexers are used, for example, as time-division switches 28a to 28c for k bits, the configuration for switching k bits is complicated to increase the processing and circuit scales.

For this reason, it is difficult to reduce the processing and circuit scales in control offices and mobil stations in cellular mobile telephone systems of a TDMA scheme, a TDMA/TDD scheme or a CDMA scheme, or satellite stations and ground stations in digital satellite communication, and especially in cellular phones, the prior art has a disadvantage of difficulties in meeting demands for size reduction and multiple functions.

In addition, while the prior arts in the gazettes described above can reduce the processing and circuit scales in the Viterbi decoding, they are susceptible to improvement in terms of simplification of the operation methods.

SUMMARY OF THE INVENTION

It is an object of the present invention to provide a branch metric calculation method and a Viterbi decoder which solve the aforementioned problems in the prior arts and reduce the number of bits in branch metric calculation processing to diminish the processing scale and the circuit scale, and for example, reduce the processing scale and the circuit scale in devices in digital cellular mobile telephone systems of TDMA, TDMA/TDD schemes or a CDMA scheme.

To achieve the aforementioned object, the branch metric calculation method in Viterbi decoding of the present invention derives a branch metric by comparing a codeword produced from a convolutional code with a sign in determination data obtained from conversion of received data for branch metric calculation. First, the determination data is divided into a sign and a metric before output. Then, a check is made to determine whether or not the divided sign matches the codeword. Next, based on the result of the match or mismatch, "0" is selected when they match or the metric is selected when they do not match. Outputs selected when the signs match are added to outputs selected when the signs do not match to calculate a branch metric.

The Viterbi decoder of the present invention derives a branch metric by comparing a codeword produced from a convolutional code with a sign in determination data obtained from conversion of received data for branch metric calculation. The Viterbi decoder comprises a metric data convertor, a code generator, a branch metric calculator, an add/compare/select operator, a path metric memory, a path information memory, and a trace back processor.

The metric data convertor outputs a plurality of metric data obtained by converting a received data sequence to soft decision symbols. The code generator generates and outputs codewords.

The branch metric calculator divides the plurality of metric data from the metric data convertor into signs and metrics, respectively, outputs them, and determines whether the divided signs match the codewords from the code generator. The branch metric calculator selects and outputs "0" when they match or selects and outputs the metrics when they do not match based on the determination result of the match or mismatch, and adds outputs selected when the signs match to outputs selected when the signs do not match to calculate a branch metric.

The add/compare/select operator adds the branch metric calculated by the branch metric calculator to a path metric of a survivor path, and makes a comparison and a selection of the metrics of two joining paths to calculate a new path metric and a survivor path. The path metric memory stores the new path metric and the survivor path metric from the add/compare/select operator, and sends a survivor path metric to the add/compare/select operator.

The path information memory holds survivor paths for a plurality of states from the add/compare/select operator. The trace back processor decodes the state with the smallest path metric at final truncation of bits from the path metric memory and survivor paths for the plurality of states from the path information memory.

According to an embodiment of the present invention, the branch metric calculator includes a plurality of division means, a plurality of determination means, a plurality of time-division selection means, and adding means.

The plurality of division means divide the plurality of input metric data into signs and metrics, respectively, and output them. The plurality of determination means determine whether or not the respective signs divided by the plurality of division means match the codewords input thereto. The plurality of time-division selection means select outputs obtained by not inverting or inverting the results of the match or mismatch determined by the plurality of determination means. The addition means add outputs selected when the signs match to the metrics divided and output by the plurality of division means selected when the signs do not match in the selection of the plurality of time-division selection means to calculate a branch metric.

According to another embodiment of the present invention, the plurality of division means are word split circuits, respectively, and each of the word split circuits divides each of the plurality of input metric data into a sign and a metric and outputs them.

According to another embodiment of the present invention, the plurality of determination means are exclusive OR gates, respectively, and each of the exclusive OR gates determines whether or not each of the signs divided by the plurality of division means matches each of the codewords input to each of the exclusive OR gates.

According to a further embodiment of the present invention, the addition means includes two adders for adding outputs when the signs match to outputs when the signs do not match based on the selection at the plurality of time-division selection means to calculate a branch metric.

In addition, according to another embodiment of the present invention, the inversion of the output result of the match or mismatch determined by each of the plurality of determination means is performed using an inverter.

According to another embodiment of the present invention, the Viterbi decoder further comprises a plurality of latch circuits on the sides of respective inputs to the plurality of word split circuits for holding the input metric data until latch pulses are input.

According to another embodiment of the present invention, each of the word split circuits divides each of the plurality of input metric data into the most significant bit for sign determination and a metric of k−1 bits.

According to another embodiment of the present invention, each of the signs and the codewords input to each of the plurality of exclusive OR gates comprises one bit.

According to another embodiment of the present invention, each of the plurality of time-division selection means is a multiplexer.

In such a branch metric calculation method and such a Viterbi decoder in Viterbi decoding of the present invention, each of the plurality of metric data is divided into the sign of the least 1 bit and the metric of k−1 bits in the branch metric calculation. A check is made to determine whether or not the divided signs (the least 1 bit) match the codewords (the least 1 bit) for each state produced from the convolutional code, and the outputs of the match or mismatch are selected by the time-division selection means for 1 bit, for example multiplexers. The outputs selected when the signs match are added to the divided and output metrics selected when the signs do not match to calculate a branch metric.

The conventional branch metric calculation shown in FIG. 1, for example, uses time-division selection means (time-division switches) for k bits for state N+128 with large processing and circuit scales.

In the branch metric calculation processing of the present invention, however, each of the plurality of time-division selection means (multiplexers) may be configured to select 1 bit from the symmetry of a butterfly structure in Viterbi decoding. In other words, the number of bits is reduced and the processing is simplified to allow the processing scale and the circuit scale to be reduced.

The above and other objects, features and advantages of the present invention will become apparent from the following description with reference to the accompanying drawings which illustrate examples of the present invention.

BRIEF DESCRIPTION OF THE DRAWINGS

FIG. 4 is a diagram for explaining a butterfly structure in state transition in the Viterbi decoder shown in FIG. 2.

DETAILED DESCRIPTION OF THE PREFERRED EMBODIMENT

Figure 2:
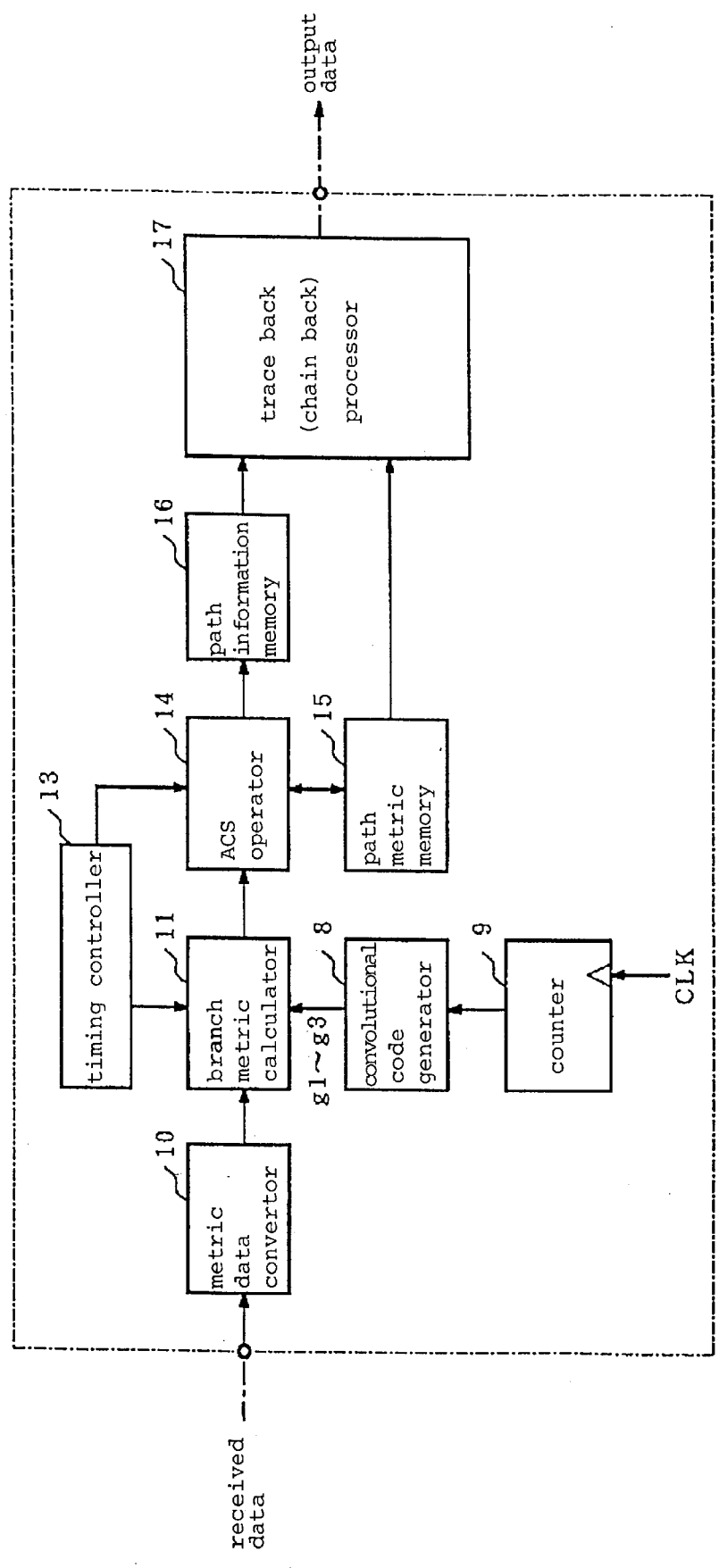
FIG. 2 is a block diagram showing a configuration of a Viterbi decoder according to one embodiment of the present invention.

Referring to FIG. 2, there is shown a Viterbi decoder according to one embodiment of the present invention which comprises convolutional code generator 8 for generating codewords for each state (codewords g0, g1 and g2 of 1 bit, later described) and counter 9 for counting 128 values (0 to 127). The Viterbi decoder according to the embodiment further comprises metric data convertor 10 for converting a received data sequence to soft decision symbols and branch metric calculator 11 for calculating branch metrics for each state. The Viterbi decoder according to the embodiment also comprises timing controller 13 for controlling timings of respective sections.

In addition, the Viterbi decoder comprises ACS operator 14 for adding the metric of a survivor path read from path metric memory 15 to the branch metric calculated by branch metric calculator 11 and for calculating a new path metric and a survivor path from the comparison and selection of the metrics of two joining paths. ACS operator 14 performs Add/Compare/Select operations for path calculation.

The Viterbi decoder according to the embodiment also comprises path metric memory 15 for storing the new path metric and survivor path metric from ACS operator 14, and path information memory 16 for holding a survivor path for each state at some point in time. In addition, the Viterbi decoder comprises trace back (chain back) processor 17 for decoding the state with the smallest path metric at the final truncation of bits and data (survivor path) from path information memory 16.

Next, the configuration of branch metric calculator 11 in FIG. 2 is described with reference to FIG. 3.

Description is made on the assumption that the coding rate is ⅓ and the number of states is 256 (which is the number of states in Viterbi decoding for normal mobile communication).

Branch metric calculator 11 comprises latch circuits 1a, 1b and 1c for latching received metric data 1, 2 and 3 for each coding block based on the coding rate before output. Branch metric calculator 11 also comprises word split circuits 2a, 2b and 2c as dividing means for dividing the outputs (metric data 1 to 3) from latch circuits 1a to 1c into signs of 1 bit and metrics of k−1 bits, respectively.

Branch metric calculator 11 further comprises EX-OR gates 3a, 3b and 3c as determination means for EX-ORing the signs of 1 bit from word split circuits 2a to 2c with the codewords (1 bit/g0, g1 and g2) for each state produced by processing in counter 9 and convolutional code generator 8. Also, branch metric calculator 11 comprises inverters 4a, 4b and 4c for 1 bit for inverting outputs from EX-OR gates 3a to 3c.

In addition, branch metric calculator 11 comprises time-division switches 5a, 5b and 5c as time-division selection means for receiving the outputs from EX-OR gates 3a to 3c and the outputs from EX-OR gates 3a to 3c through inverters 4a to 4c to select and output either of them in accordance with timing pulses.

Branch metric calculator 11 further comprises selectors 6a, 6b and 6c for outputting 0(z) if the outputs from time-division switches 5a to 5c are 0 (indicating that the signs matches), or outputting the metrics from word split circuits 2a to 2c if the outputs are 1 (indicating that the signs do not match), respectively. Branch metric calculator 11 comprises adders 7a and 7b as addition means for calculating a branch metric from the outputs from selectors 6a to 6c. EX-OR gates 3a to 3c receive the codewords (1 bit/g0, g1 and g2) for each state from convolutional code generator 8 shown in FIG. 3. Convolutional code generator 8 receives the counted number of states (one of 128 values from 0 to 127) from counter 9 with an input clock signal (CLK).

Next, description is made for the operation of branch metric calculator 11 in the Viterbi decoder according to the embodiment.

First, an overview (outlines) of the operation is provided. As shown in FIG. 3, the metric data are divided into the signs and the metrics at word split circuits 2a to 2c. Then, EX-OR gates 3a to 3c make determination about the signs of 1 bit.

As a result, from the symmetry of a butterfly structure in the Viterbi decoding, each of a plurality of time-division selection means (multiplexer) may be configured to select 1 bit. Specifically, branch metric calculation processing may be performed with inverters 4a to 4c for 1 bit and time-division switches 5a to 5c for 1 bit, and the number of bits is reduced in the processing.

Thus, the processing is simplified to allow reductions in the processing scale and the circuit scale. This can reduce the processing scale and the circuit scale in control offices and mobile stations in cellular mobile telephone systems of a TDMA scheme, a TDMA/TDD scheme or a CDMA scheme, or satellite stations and ground stations in digital satellite communication.

The operation of the Viterbi decoder according to the embodiment is hereinafter described in detail.

In the Viterbi decoder shown in FIG. 2, received data is supplied to metric data convertor 10. Metric data convertor 10 converts the received data to determination data for branch metric calculation. For example, if the received data is soft decision data of 3 bits, it is converted to data of 4 bits. In this case, the most significant bit represents a sign, and the remaining 3 bits represent the metric for the code. The determination data from metric data convertor 10 is supplied to branch metric calculator 11.

Figure 3:
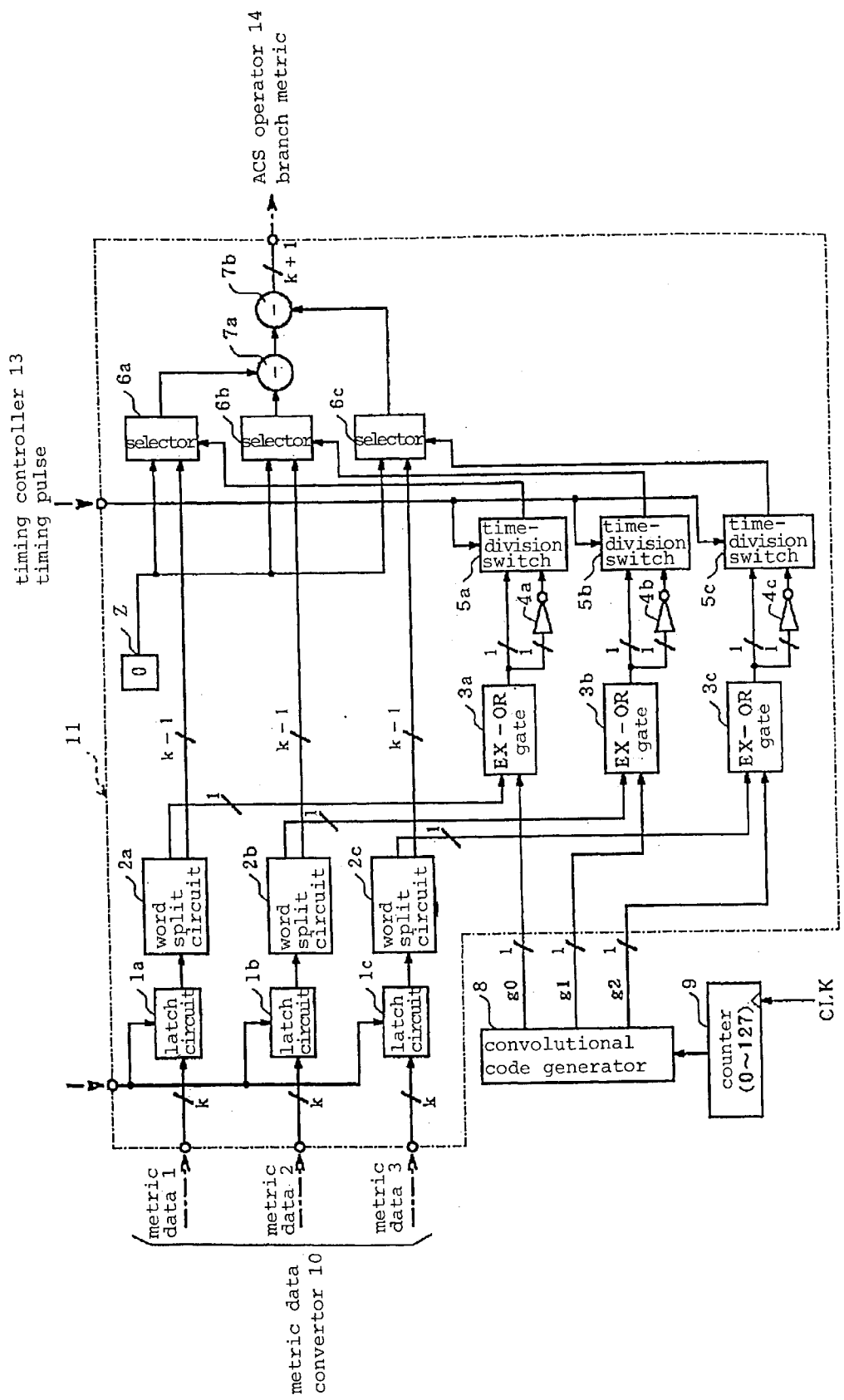
FIG. 3 is a block diagram showing a configuration of a branch metric calculation circuit in FIG. 2.

Next, the operation of branch metric calculator 11 shown in FIG. 3 is described.

The branch metric calculation is described on the assumption that the coding rate is ⅓, the determination data includes k bits, and the constraint length k=9 (the number of states is 256).

Branch metric calculator 11 receives the determination data (metric data) from metric data convertor 10 for each coding block. In branch metric calculator 11, latch circuits 1a to 1c shown in FIG. 3 hold metric data 1 to 3 until latch pulses are received from timing controller 13. Metric data 1 to 3 are output to word split circuits 2a to 2c from latch circuits 1a to 1c with the input of the latch pulses. Word split circuits 2a to 2c divide metric data 1 to 3 into the most significant bits for sign determination and the metrics of k−1 bits, respectively.

On the other hand, convolutional code generator 8 shown in FIG. 3 outputs codewords g0 to g2 of 1 bit for each state generated by generator 8 and counter 9 to EX-OR gates 3a to 3c, respectively. EX-OR gates 3a to 3c receive the respective signs of the most significant bits from word split circuits 2a to 2c, and EX-OR the signs of the 1 bit with codewords g0 to g2 of 1 bit for each state generated by convolutional code generator 8. In the EX-OR processing, 0 is output if the signs match, or 1 is output if the signs do not match, at count N (one of 128 values from 0 to 127) of counter 9.

The outputs (0 or 1) from EX-OR gates 3a to 3c are input to time-division switches 5a to 5c. In time-division processing at time-division switches 5a to 5c, the outputs from EX-OR gates 3a to 3c are selected and output as they are, or the inverted outputs through inverters 4a to 4c are selected and output, in accordance with timing pulses from timing controller 13.

It should be noted that the outputs inverted by inverters 4a to 4c are selected for deriving branch metrics from N+128 state. The timing pulses for the switching are provided at a speed four times higher than the clock signal (CLK) of counter 9, and thus, four branch metrics 20, 21, 22 and 23 in a butterfly structure shown in FIG. 4 are output. The symmetry in the Viterbi decoding is described later.

Next, selectors 6a to 6c output 0 to adders 7a and 7b if the outputs selected by time-division switches 5a to 5c of 1 bit are 0 (indicating that the signs match), or output the metrics of k−1 bits divided by word split circuits 2a to 2c to adders 7a and 7b if the selected outputs are 1 (indicating the signs do not match). Then, the branch metric is calculated at adders 7a and 7b.

Figure 1:
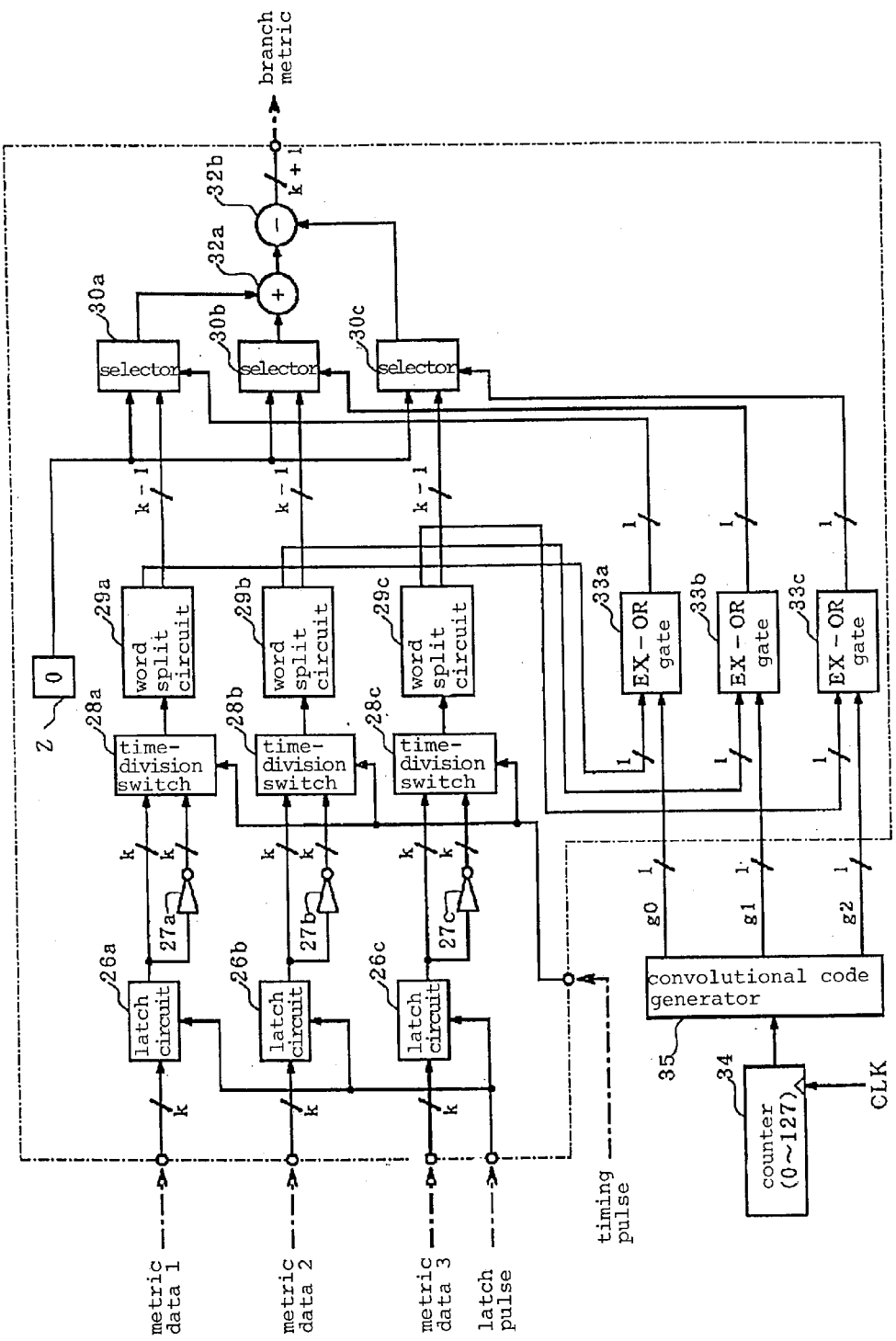
FIG. 1 is a circuit diagram showing a configuration for performing prior art branch metric calculation.

In this manner, branch metric calculation circuit 11 in the embodiment differs from the branch metric calculation circuit of the prior art in FIG. 1 in that the former uses no inverters 27a to 27c (for metric data outputs of k bits for state N+128) and no time-division switches 28a to 28c for k bits in FIG. 1. Thus, in the embodiment, when the metric data for state N+128 is selected, inverters 4a to 4c for 1 bit and time-division switches 5a to 5c for 1 bit are used after the EX-ORing, and the branch metric calculation is performed. Thus, the number of bits can be reduced.

Next, the symmetry of the Viterbi decoder is described with reference to FIG. 4 which is a diagram for explaining the butterfly structure in state transition in the Viterbi decoder.

Description is made on the assumption that the code length k=9 and the number of state is 256. N in FIG. 4 represents the unit of blocks in the butterfly structure, and corresponds to the count at counter 9 for providing the number of states in FIG. 3. This butterfly structure need derive two branch metrics from two states, i.e. four branch metrics in total. However, the branch metrics need not be calculated one by one with time-division switching in the process of deriving one branch metric.

As shown in equations in FIG. 4, BmN,0 (branch metric 20 when path 0 is input from state N) is equal to BmN+128,1 (branch metric 23 when path 1 is input from state N+128). In addition, BmN,1 (branch metric 22 when path 1 is input from state N) is equal to BmN+128,0 (branch metric 21 when path 0 is input from state N+128).

The codewords of BmN,0 and BmN+128,0 are merely inverted. Thus, time-division switches 5a to 5c for 1 bit in FIG. 3 may switch between the non-inverted outputs and the inverted outputs (outputs from inverters 4a to 4c). As a result, a branch metric is calculated for each clock of the timing pulses.

For the path metrics at the next point, path metrics (Pm2N(T+1), Pm2N+1(T+1)) 24, 25 for two states need be written at count N. The write may also be performed in turn by switching the branch metrics in a time-division manner.

As apparent from the description, according to the branch metric calculation method and the Viterbi decoder in the Viterbi decoding of the embodiment, each of a plurality of metric data is divided into the sign of the least 1 bit and the metric of k−1 bits to make determination about the match. The output indicating the match or mismatch of one bit is selected by the time-division selection means for 1 bit, for example a multiplexer.

As a result, from the symmetry of the butterfly structure in the Viterbi decoding, each of the plurality of the time-division selection means (multiplexers) may be configured to select 1 bit to reduce the number of bits in the branch metric calculation processing. Thus, the processing is simplified to allow the processing scale and the circuit scale to be reduced.

While a preferred embodiment of the present invention has been described using specific terms, such description is for illustrative purposes only, and it is to be understood that changes and variations may be made without departing from the spirit or scope of the following claims.

What is claimed is:

1. A method of calculating a branch metric in Viterbi decoding for deriving a branch metric by comparing a codeword produced from a convolutional code with a sign of determination data obtained from conversion of received data for branch metric calculation, said method comprising the steps of:

dividing said determination data into a sign and a metric and outputting them;

determining whether said divided sign matches said codeword or not and outputting a determination signal and an inverted determination signal as a result thereof;

outputting, on a time-division basis, either the determination signal or the inverted determination signal based on timing pulses;

selecting and outputting, based on an output of the outputting step, "0" when said divided sign matches said codeword or selecting and outputting said metric when said divided sign does not match said codeword; and adding outputs selected when the signs match to outputs selected when the signs do not match to calculate a branch metric.

2. A Viterbi decoder for deriving a branch metric by comparing a codeword produced from a convolutional code with a sign of determination data obtained from conversion of received data for branch metric calculation, comprising:

metric data conversion means for outputting a plurality of metric data which are soft decision symbols converted from a received data sequence;

code generation means for generating and outputting said codeword;

branch metric calculation means for dividing the plurality of metric data from said metric data conversion means into signs and metrics, respectively, outputting them, determining whether the divided signs match the codewords from said code generation means and outputting a determination signal and an inverted determination signal based on the determination, outputting one of the determination signal and the inverted determination signal on a time-division basis, selecting and outputting, under control of the outputted one of the determination signal and the inverted determination signal, "0" when the divided signs match the codewords or selecting and outputting said metrics when the divided signs do not match the codewords, and adding outputs selected when the signs match to outputs selected when the signs do not match to calculate a branch metric;

add/compare/select operation means for adding the branch metric calculated by said branch metric calculation means to a survivor path metric, and making a comparison of two joining metrics paths to obtain a new path metric and a survivor path;

path metric memory means for storing the new path metric and the survivor path metric from said add/compare/select means and for supplying said add/compare/select operation means with a survivor path metric;

path information memory means for storing survivor paths with a plurality of states from said add/compare/select operation means; and trace back processing means for decoding a state with the smallest path metric at final truncation of bits from said path metric memory means and the survivor paths with the plurality of states from said path information memory means.

3. A Viterbi decoder for deriving a branch metric by comparing a codeword produced from a convolutional code with a sign of determination data obtained from conversion of received data for branch metric calculation, comprising:

metric data conversion means for outputting a plurality of metric data which are soft decision symbols converted from a received data sequence;

code generation means for generating and outputting said codeword;

branch metric calculation means for dividing the plurality of metric data from said metric data conversion means into signs and metrics, respectively, outputting them, determining whether the divided signs match the codewords from said code generation means, selecting and outputting "0" when they match or selecting and outputting said metrics when they do not match based on the determination result of the match or mismatch, and adding outputs selected when the signs match to outputs selected when the signs do not match to calculate a branch metric;

add/compare/select operation means for adding the branch metric calculated by said branch metric calculation means to a survivor path metric, and making a comparison of two joining metrics paths to obtain a new path metric and a survivor path;

path metric memory means for storing the new path metric and the survivor path metric from said add/compare/select means and for supplying said add/compare/select operation means with a survivor path metric;

path information memory means for storing survivor paths with a plurality of states from said add/compare/select operation means; and trace back processing means for decoding a state with the smallest path metric at final truncation of bits from said path metric memory means and the survivor paths with the plurality of states from said path information memory means, wherein said branch metric calculation means includes:

a plurality of division means for dividing each of the plurality of input metric data into signs and metrics and outputting them;

a plurality of determination means for determining whether or not the respective signs divided by each of said plurality of division means match the codewords input thereto;

a plurality of time-division selection means for selecting either outputs obtained by not inverting the results of the match or outputs obtained by inverting the results of the mismatch determined by each of said plurality of determination means; and addition means for adding outputs from said pluralities of time-division selection means when the signs match to the metrics divided and output by said plurality of division means selected when the signs do not match to obtain a branch metric.

4. The Viterbi decoder according to claim 3, wherein each of said plurality of division means is a word split circuit for dividing each of the plurality of input metric data into a sign and a metric and outputting them.

5. The Viterbi decoder according to claim 3, wherein each of said plurality of determination means is an exclusive OR gate for determining whether or not each of the signs divided by said plurality of division means matches each of the codewords input to each of said exclusive OR gates.

6. The Viterbi decoder according to claim 3, wherein said addition means includes two adders for adding outputs when the signs match to outputs when the signs do not match based on the selection at said plurality of time-division selection means to obtain a branch metric.

7. The Viterbi decoder according to claim 3, wherein the inversion of the output result of the mismatch determined by each of said plurality of determination means is performed using an inverter.

8. The Viterbi decoder according to claim 4, further comprising a plurality of latch circuits on the sides of respective inputs to said plurality of word split circuits for holding the input metric data until latch pulses are input.

9. The Viterbi decoder according to claim 4, wherein each of said word split circuits divides each of the plurality of input metric data into the most significant bit for sign determination and a metric of k1 bits.

10. The Viterbi decoder according to claim 5, wherein each of the signs and the codewords input to each of said plurality of exclusive OR gates comprises one bit.

11. The Viterbi decoder according to claim 3, wherein each of said plurality of time-division selection means is a multiplexer.

12. The Viterbi decoder according to claim 1, wherein said determination data is divided into the sign and the metric prior to the outputting of the determination signal or the inverted determination signal on a time-division basis.

* * * * *